United States Patent [19]

Masuhara et al.

[11] 4,261,004
[45] Apr. 7, 1981

[54] SEMICONDUCTOR DEVICE

[75] Inventors: Toshiaki Masuhara, Hachioji; Osamu Minato, Kokubunji; Yoshio Sakai, Hachioji; Toshio Sasaki, Hachioji; Masaharu Kubo, Hachioji; Kotaro Nishimura, Kokubunji; Tokumasa Yasui, Kodaira, all of Japan

[73] Assignee: Hitachi, Ltd., Tokyo, Japan

[21] Appl. No.: 929,959

[22] Filed: Aug. 1, 1978

[30] Foreign Application Priority Data

Aug. 10, 1977 [JP] Japan .................................. 52-95045

[51] Int. Cl.³ ........................................... H01L 27/02
[52] U.S. Cl. ........................................ 357/51; 357/23; 357/41; 357/55; 357/59; 357/68
[58] Field of Search ..................... 357/23, 41, 51, 55, 357/59, 68

[56] References Cited

U.S. PATENT DOCUMENTS

| 4,077,044 | 2/1978 | Hayashi et al. | 357/59 |
| 4,110,776 | 8/1978 | Rao et al. | 357/51 |

Primary Examiner—Edward J. Wojciechowicz
Attorney, Agent, or Firm—Craig and Antonelli

[57] ABSTRACT

On the surface of an insulating film formed on the surface of a semiconductor substrate on which an MOS type semiconductor device to be protected is formed, there are formed a first polycrystal silicon member having input and output terminals and a resistivity lower than 1 K$\Omega$/□ and a second polycrystalline silicon member having a resistivity lower than 1 K$\Omega$/□ and being maintained at a fixed potential. This second polycrystalline silicon member faces at least a part of the first silicon member with polycrystalline silicon of a resistivity higher than 100 K$\Omega$/□ interposed therebetween. The input terminal of the first polycrystalline silicon member is connected to an input pad of the MOS type semiconductor device to be protected and the output terminal of the first polycrystalline silicon member is connected to an input gate of the semiconductor device to be protected. The input gate of the semiconductor device is protected by utilizing the punchthrough effect in the interior of the polycrystalline silicon having a resistivity higher than 100 K$\Omega$/□.

29 Claims, 7 Drawing Figures

SEMICONDUCTOR DEVICE

LIST OF THE PRIOR ART

Japanese Patent Application Laid-Open Specification No. 14384/77.

BACKGROUND OF THE INVENTION

1. Field of the Invention

The present invention relates to a semiconductor device having a novel structure. More particularly, the invention relates to a semiconductor device effective for protecting from external surge voltages an element connected to an input or output terminal of a semiconductor device of the insulated gate type (hereinafter referred to as "IG type").

2. Description of the Prior Art

In the conventional IC of the complementary MOS type (hereinafter referred to as "CMOS"), an element connected to an input or output terminal of the CMOSIC may be protected from external surge voltages by an input gate-protecting diffusion resistance layer formed in a semiconductor substrate on which the CMOSIC is formed and by a device for protecting the gate by a p-n diode. In some cases, however, in this protecting device, when a thyristor constructed of a parasitic transistor is turned on, a large current flows and chips are burnt out. Accordingly, it is construed that this protecting device cannot be a complete protecting device.

BRIEF SUMMARY OF THE INVENTION

It is, therefore, a primary object of the present invention to provide a semiconductor device effective as a gate-protecting device for MOS type elements, in which the foregoing problem in conventional gate-protecting devices for MOS type elements (or IG type elements) is completely solved.

In accordance with the present invention, this and other objects can be attained by a semiconductor element comprising a first resistor (inclusive of a conductor) formed on the surface of an insulating member and having at least one terminal, and a second resistor (inclusive of a conductor) maintained at a fixed potential and facing at least a part of the first resistor with a semiconductor (inclusive of an insulator) being interposed therebetween.

As the above-mentioned insulating member, there is preferably used an insulating film formed on the surface of a semiconductor substrate on which a semiconductor device to be protected is formed. The first resistor has preferably input and output terminals, the input terminal being connected to an input or output pad, and the output terminal being connected to an input or output terminal of the semiconductor device.

The first and second resistors are preferably formed by forming on the above insulating film a semiconductor material such as polycrystalline silicon, free of impurities or containing very small amounts of impurities and doping impurities into portions to be formed into the first and second resistors.

When a semiconductor device of the present invention, having the above-mentioned specific structure, is used as a protecting device, even if an excessive voltage is applied, for example, to an input pad, this excessive voltage is not applied to an input terminal of a semiconductor device by virtue of conduction between the first and second resistors owing to the punch-through effect in the interior of the semiconductor material. The clamp value can be freely set according to the width of the semiconductor material. The resistivity of the semiconductor material is preferably higher than about 100 $K\Omega/\square$, and it is preferred that the resistivity of each of the first and second resistors be lower than about 1 K $\Omega/\square$. When the semi-conductor device to be protected is of the MOS type, the resistance of the first resistor between the input and output pads and the input and output terminals of the semiconductor device is set at about 0.5 to about 10 $K\Omega$.

In view of the heat discharge, it is preferred that the second resistor be formed on both sides of a part of the first resistor with the semiconductor material being interposed therebetween.

Further, it is preferred that ground potential or a power source potential of the semiconductor device be used as the fixed potential at which the second resistor is maintained.

DETAILED DESCRIPTION OF THE PRIOR ART

Prior to describing embodiments of the present invention, the conventional protecting device for CMOSIC is described by reference to FIG. 1.

Figure 1:
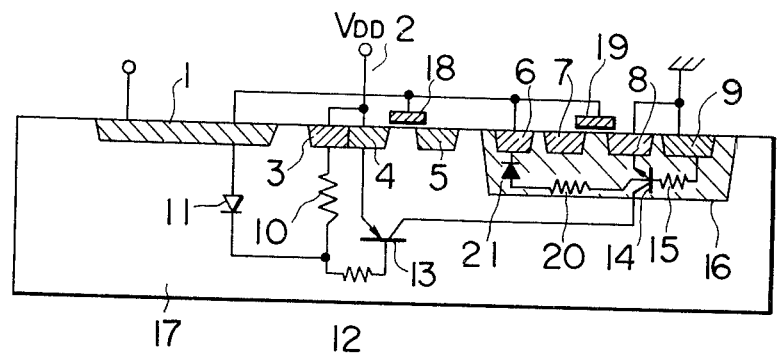
FIG. 1 is a sectional view illustrating, diagrammatically, the structure of a conventional input gate-protecting device for a CMOSIC.

Referring to FIG. 1, in an n-type substrate 17, there are formed an inverter comprising an N-channel type MOS transistor including an $n^+$-type source layer 8, an $n^+$-type drain layer 7 and a gate 19, a P-channel type MOS transistor including a $p^+$-type source layer 4, a $p^+$-type drain layer 5, a gate 18, and a gate-protecting device comprising a $p^+$-type resistance layer 1 for protecting the input gate of the inverter and p-n diodes 11 and 21. Reference numeral 2 represents a power source terminal and reference numerals 3 and 9 denote channel stoppers of $n^+$-type and $p^+$-type layers, respectively, which also provide low resistivity contact to n-type substrate 17 and p-type well 16. Reference numeral 6 represents an n-type layer for the diode 21.

The gate-protecting device of this type is defective in that a thyristor constructed of parasitic transistors 13 and 14 is triggered by the diode 11 or 21 according to the values of parasitic resistances 10, 12, 20, and 15 and is thus turned on. More specifically, when a large positive or negative voltage pulse is applied to the input pin, the thyristor is turned on (this is called the "latch-up phenomenon") and a large current flows and ultimately the chip will burn out. This is a fatal defect hindering practical application of CMOS.

DETAILED DESCRIPTION OF THE INVENTION

The present invention will now be described in detail by reference to embodiments illustrated in the accompanying drawings.

Figure 2A:
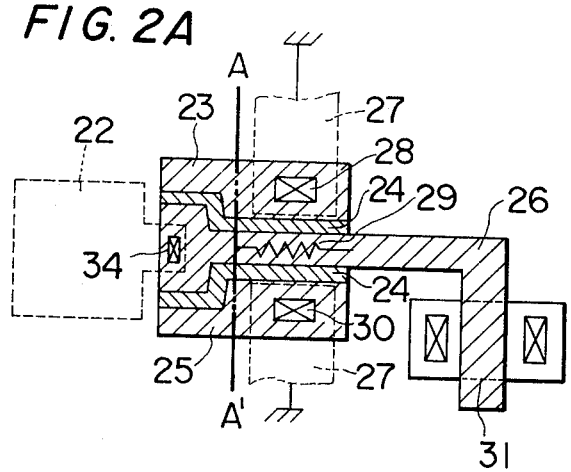
FIG. 2A is a view showing the planar structure of one embodiment of the semiconductor device of the present invention.
Figure 2B:
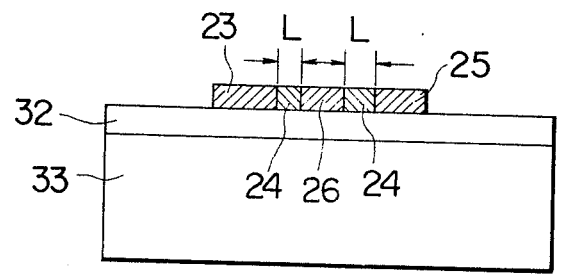
FIG. 2B is a view showing sectional structure of this semiconductor device.

A first embodiment relates to a semiconductor device-protecting device in which polycrystalline silicon members are used for the first and second resistors and the semiconductor material. The semiconductor device to be protected in this embodiment is a gate of a semiconductor device of the MOS type. In the present embodiment, a second resistor maintained at ground potential is disposed on both sides of the first resistor connecting the input pad to a gate electrode with the semiconductor material interposed therebetween. The structure of the present embodiment is illustrated in FIG. 2. FIG. 2A is a plan view and FIG. 2B shows a sectional view taken along the line A—A' in FIG. 2A. Reference numeral 26 represents the region of the above-mentioned first resistor and reference numerals 23 and 25 represent the regions of the second resistor. Reference numeral 27 denotes an electric conductor for maintaining the second resistor regions 23 and 25 at a fixed potential. Reference numerals 28 and 30 represent portions of an ohmic contact between the second resistor regions 23 and 25 and the electric conductor 27. Reference numeral 24 denotes a region of the above-mentioned semiconductor material. Reference numeral 22 denotes an input bonding pad and reference numeral 31 represents a gate electrode of an MOS type semiconductor device to be protected which is formed integrally with the first resistor region 26. Reference numeral 29 denotes a protecting resistance and reference numeral 34 represents a portion of the ohmic contact between the semiconductor element of the present invention and the bonding pad. Reference numeral 33 represents a semiconductor substrate on which sources and drains of the MOS type semiconductor device to be protected are formed. Reference numeral 32 represents an insulating layer formed on the surface of the semiconductor substrate 33. In this embodiment, each of the first resistor region 26, gate electrode 31, and second resistor regions 23 and 25 is formed of polycrystalline silicon (Si) n+ diffused with, for example, phosphorus (P) and the semiconductor material 24 is formed of polycrystalline Si that is not doped with impurities or contains very small amounts of impurities. The first and second resistor regions 23, 25, and 26 are characterized by an impurity concentration higher than $1 \times 10^{19}$ atoms/cm$^3$ and a resistivity lower than 1 K$\Omega$/□, and the semiconductor region 24 is characterized by an impurity concentration lower than $1 \times 10^{13}$ atoms/cm$^3$ and a resistivity higher than 100 K$\Omega$/□. Formation of the first and second resistor regions 23, 25, and 26 and the semiconductor region 24 is accomplished by the formation of a polycrystalline Si layer having a desirable configuration on the surface of the insulating film 32 and introducing impurities into the so-formed polycrystalline Si layer except the portion to be formed into the semiconductor region 24. As a result, as shown in FIGS. 2A and 2B, the second resistor regions 23 and 25 are located on both side faces of a part of the first resistor region 26 through the semiconductor region 24 interposed therebetween. L in FIG. 2B indicates the length of the spacing between the first resistor and the second resistor.

The operation of the semiconductor device of the embodiment shown in FIGS. 2A and 2B will now be described by reference to FIG. 3.

Figure 3:
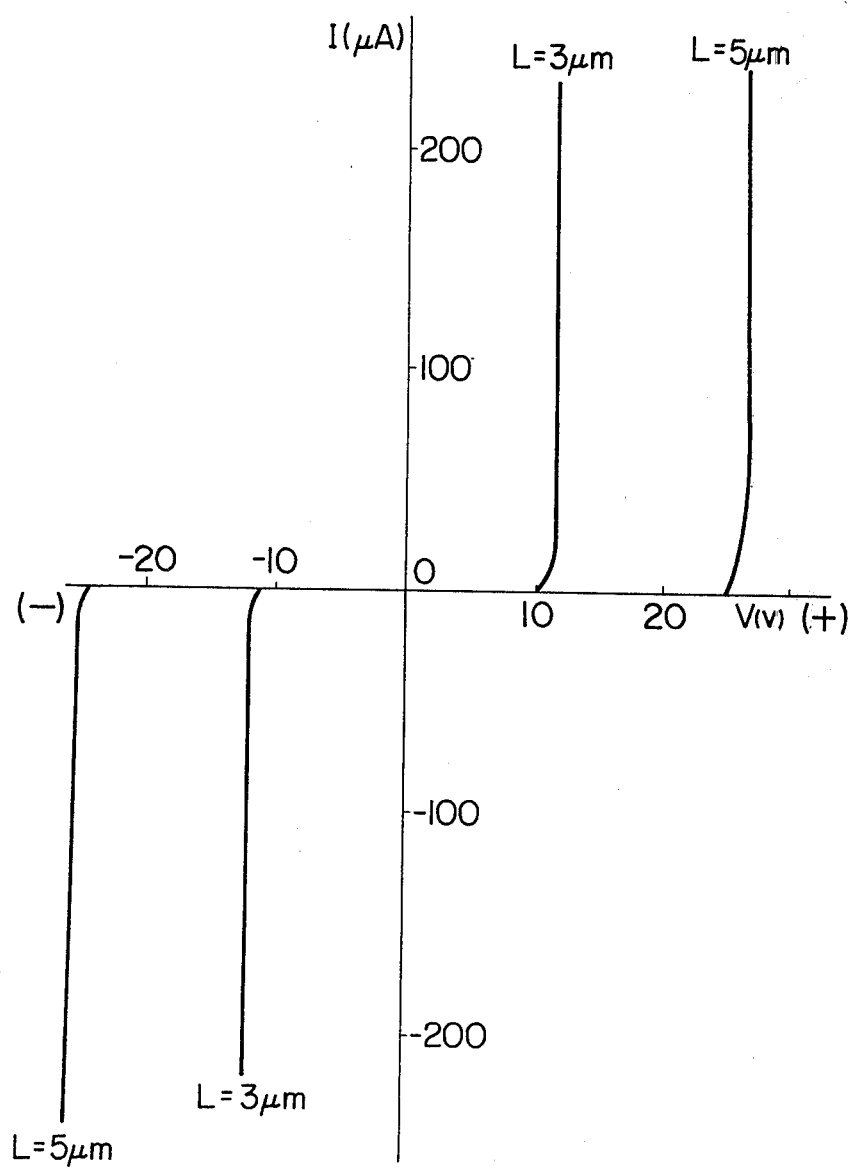
FIG. 3 is a diagram illustrating characteristics of the semiconductor device of the present invention shown in FIGS. 2A and 2B, in which the abscissa indicates a voltage applied between the first and second resistors and the ordinate indicates the intensity of a current flowing between the first and second resistors.

FIG. 3 illustrates current-voltage characteristics between the resistor regions 23 and 26 or between the resistor regions 25 and 26. When the width W of the highly-resistant semiconductor region 24 is 100 $\mu$m, the resistance between both terminals is higher than $10^{10}\Omega$ and substantially complete insulation is attained. However, when a voltage higher than 10 V, in a case where the device in which L is 3 $\mu$m, or a voltage higher than 25 V, in a case where the device in which L is 5 $\mu$m, is applied between both terminals, the element is rendered conductive. Namely, when the second resistor regions 23 and 25 of the present element are grounded, even if an excessive voltage is applied to the input pin, the present element is clamped at ±10 to ±15 V, where L=3 $\mu$m, or at ±25 to ±30 V, where L=5 $\mu$m. In short, application of an excessive voltage to the insulating film below the gate electrode 31 is avoided. Accordingly, the gate of the MOS transistor at the input terminal of the MOS type semiconductor device can be completely protected.

Further, in the present embodiment, since the protecting resistance 29 is integrated with the first resistor, even if an excessive voltage is applied to the input pin, at the gate electrode 31 the peak value is reduced to a low voltage. This is another effect attained in the present embodiment.

In the foregoing illustration, the potential of the second resistor regions 23 and 25 is ground potential, but this potential is not particularly critical and a power source potential to be applied to the drain of the MOS type semiconductor device or other optional potential can be used.

Figure 4:
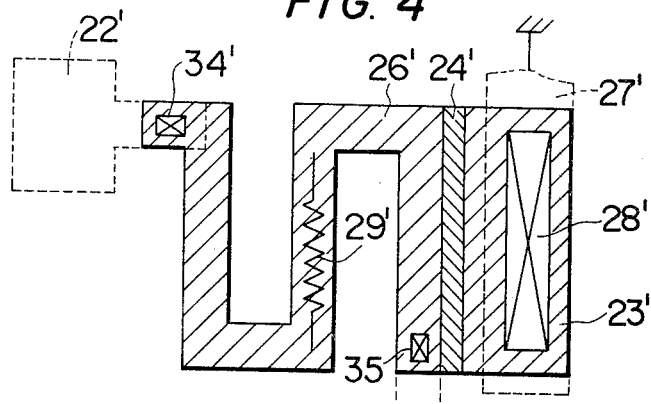
FIGS. 4, 5, and 6 are diagrams illustrating plane structures of other embodiments of the semiconductor device of the present invention.

FIG. 4 illustrates a second embodiment in which the semiconductor device of the present invention is used as a protecting device.

The embodiment shown in FIG. 4 is different from the embodiment shown in FIGS. 2A and 2B with respect to the planar structure. The first resistor is bent for reducing the area and the second resistor is disposed only on one side of a part of the first resistor. Broken line illustrated portions in FIG. 4 represent members having the same functions as those of the members indicated by the same reference numerals in FIGS. 2A and 2B. Reference numeral 35 represents a portion of an ohmic contact between the semiconductor element of the present invention and the gate electrode 31'.

In the present embodiment, an input-protecting resistance 29' is formed in the first resistor region 26' extending from a portion 34' of ohmic contact with an input pad 22' to the portion where the first resistor region 26' confronts the second resistor region 23' through a semiconductor region 24'.

Figure 5:
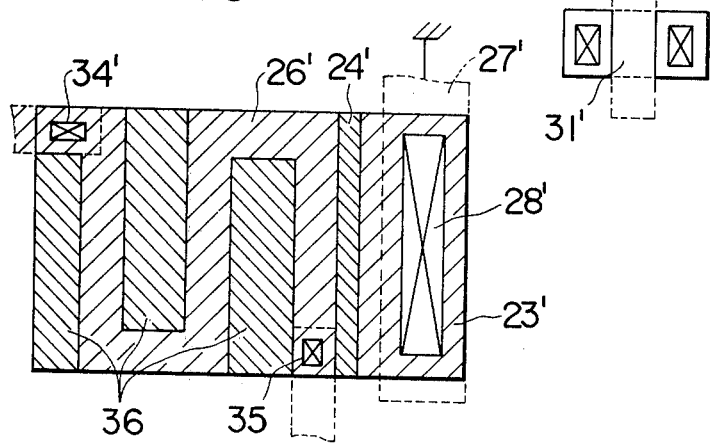

A third embodiment of the device of the present invention shown in FIG. 5 is different from the embodiment shown in FIG. 4 in that, since polycrystalline Si, before formation of the first and second resistor regions 26' and 23', has a rectangular shape, after formation of the first and second resistor regions 26' and 23' there is left a highly-resistive polycrystalline Si region 36.

In each of the second and third embodiments, the portion of the first resistor region facing the second resistor region through the semiconductor region has the same characteristics as those shown in FIG. 3. In the fourth embodiment, however, the width of the polycrystalline Si region 36 in the first resistor region 26' should be sufficiently larger than the width of the semiconductor region 24'.

Not only n-type impurities but also p-type impurities may be introduced into polycrystalline Si. Further, in some cases, the conductivity of impurity-containing polycrystalline Si forming the first resistor may be different from the conductivity of impurity-containing polycrystalline Si forming the second resistor. In the foregoing illustration, the semiconductor material is composed of intrinsic polycrystalline Si. Needless to say, the semiconductor material may be composed of $p^-$-type or $n^-$-type polycrystalline Si.

Figure 6:
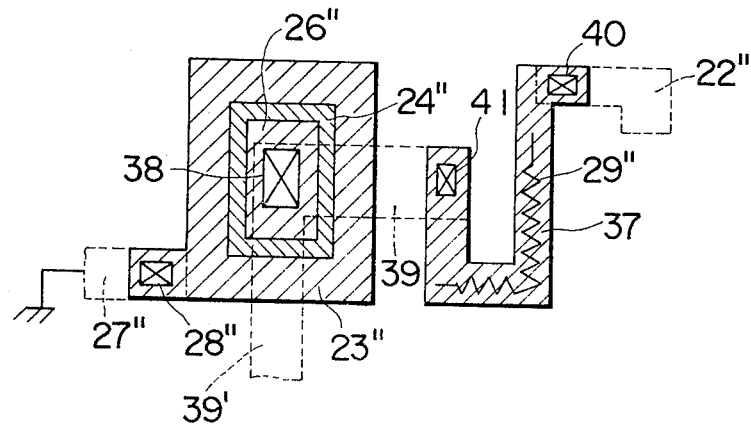

FIG. 6 is a plan view showing another embodiment of the semiconductor device of the present invention. This embodiment is characterized in that the protecting resistance and the semiconductor device of the present invention are formed in different regions. Namely, a protecting resistance region 37 composed of polycrystalline silicon containing desired impurities is formed on the surface of the insulating film to have a portion 40 in ohmic contact with an input pad 22''. The semiconductor device of the present invention comprises a first resistor region 26'' having one terminal, a semiconductor region 24'' formed to surround the region 26'', and a second resistor region 23'' formed to surround the semiconductor region 24''. The second resistor region 23'' is maintained at ground potential by an electrical conductor 27'' through an ohmic contact portion 28''. The first resistor region 26'' is connected to electrical conductors 39 and 39' at an ohmic contact portion 38, and these electrical conductors 39 and 39' are connected to the protecting resistance region 37 and a semiconductor device (not shown) to be protected, respectively. Reference numeral 41 represents a portion of an ohmic contact between the electrical conductor 39 and the protecting resistance region 37.

In the present embodiment, terminals to be connected to the protecting resistance region or input pad and the semiconductor device to be protected may be independently formed in the first resistor region 26''. However, this arrangement is unnecessary when the protecting resistance region 37 is formed independently. The positional arrangement of the first resistor 26'' and the second resistor region 23'' may be reversed.

The present invention is by no means limited by the foregoing embodiments, but various changes and modifications may be made. For example, when the semiconductor element of the present invention is used as a protecting device, it may be applied to not only an MOS type semiconductor device but also a bipolar semiconductor device. Further, the semiconductor element of the present invention may be inserted between an output terminal of a semiconductor device, which is composed of an $n^+$-type or $p^+$-type diffusion layer, and an output bonding pad. Still further, the first and second resistor regions and semiconductor region of the semiconductor device of the present invention may be composed of a material other than polycrystalline silicon; for example, a compound semiconductor such as GaAs may be used. Of course, the material of the first and second resistors need not always be the same as that of the semiconductor material. For example, polycrystalline Ge or a metal such as Mo or W may be used for the resistors, and polycrystalline Ge may be used for the semiconductor material.

As will be apparent from the foregoing illustration of the embodiments of the present invention, a particular method need not especially be used for the production of the semiconductor device of the present invention.

The effects attained when the semiconductor device of the present invention is used as a protecting device will now be described.

In the present invention, since the punch-through effect of a semiconductor (insulator) or break-down of a junction is utilized and an insulating film is independently formed on the surface of a substrate on which a semiconductor device is formed, destruction of the element per se is not caused. Further, in the conductive state, no electric current passes through the interior of the substrate. Furthermore, in the semiconductor device of the present invention, since a p-n diode is not used in the substrate, occurrence of the latch-up phenomenon can be completely prevented when the element is applied to CMOSIC. Still further, in the case of planar structure as shown in the foregoing first to fourth embodiments, since only one layer is additionally formed on the insulating film on the surface of the substrate, the structure is very simple and the device can be produced very easily.

Furthermore, in the foregoing embodiments of the present invention, since only one type of the semiconductor material, namely an n-type or p-type semiconductor alone, is necessary, production of the device can be further facilitated.

In addition, in the first embodiment of the present invention, when a gate electrode of an MOS transistor is prepared according to the silicon gate method, the device can be prepared in the same manner as in the case of conventional devices without increasing the number of masks. In general, after deposition of impurity-free polycrystalline silicon having a desired configuration, incorporation of impurities into a part of the substrate and gate polycrystalline silicon is performed while covering a portion where incorporation of impurities is unnecessary, with a film of $SiO_2$. In production of the device of the present invention, if diffusion of impurities or injection of ions is carried out in the state where the portion of the semiconductor region 24 is covered with a film of $SiO_2$, the structure of the first embodiment of the present invention can be easily obtained.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

We claim:

1. A semiconductor device comprising:
   a semiconductor substrate having an insulating layer disposed on one surface thereof;
   a transistor to be protected provided on said substrate;
   a terminal layer which is used for one of signal input and signal output to said transistor and is comprised of metal and disposed on a first portion of said insulating layer;
   a first resistor layer comprised of silicon containing impurities, disposed on a second portion of said insulating layer, and having two terminals, the first of which is connected to one terminal of said transistor, and the second of which is connected to said terminal layer;

a second resistor layer comprises of silicon containing impurities, disposed on a third portion of said insulating layer, and spaced apart from said first resistor layer, wherein said second resistor layer is coupled to a source of fixed reference potential and is not coupled to said one transistor terminal and said terminal layer to which said first resistor is coupled; and an intermediate layer comprised of silicon having conductivity characteristics different than that of said first and second resistor layers, disposed on a fourth portion of said insulating layer between said second and third portions thereof, and being contiguous with each of said first and second resistor layers wherein the conductivity characteristics of the intermediate layer are set so that said intermediate layer is an insulator which electrically insulates said first and second resistors from one another until a predetermined voltage potential between the first and second resistors across said intermediate layer is reached.

2. A semiconductor device according to claim 1, wherein said second resistor layer is disposed on both sides of at least a part of said first resistor layer with said intermediate layer being interposed therebetween.

3. A semiconductor device according to claim 1, wherein said second resistor layer is disposed along the entire periphery of said first resistor layer with said intermediate layer being interposed therebetween.

4. A semiconductor device according to claim 1, wherein said second resistor layer is comprised of first and second resistor segments disposed on said layer of insulating material on opposite sides of said first resistor layer, and said intermediate layer is comprised of first and second silicon segments disposed on said layer of insulating material on opposite sides of said first resistor layer so that said first silicon segment is contiguous with said first resistor segment and one side of said first resistor layer and said second silicon segment is contiguous with said second resistor segment and the side of said first resistor layer opposite said one side thereof.

5. A semiconductor device according to claim 4, wherein each of said first and second resistor segments is coupled to said source of fixed reference potential.

6. A semiconductor device according to claim 1, wherein the distance between opposite sides of said first resistor layer is greater than the width of said intermediate layer between said first and second resistor layer.

7. A semiconductor device according to claim 1, wherein said second resistor layer is disposed so as to surround said first resistor layer and said intermediate layer is contiguous with the entirety of the interior portion of said second resistor layer and the outer portion of said first resistor layer.

8. A semiconductor device according to claim 1, wherein said first resistor layer has a serpentine shaped portion between the mutually facing sides of which are disposed layers of highly resistive polycrystalline silicon material.

9. A semiconductor device according to claim 1, wherein said intermediate layer comprises silicon containing impurities less than that of said first and second resistor layers.

10. A semiconductor device according to claim 9, wherein the silicon of said first and second resistor layers has an impurity concentration higher than $1 \times 10^{19}$ atoms/cm$^3$, and the silicon of said intermediate layer has an impurity concentration lower than $1 \times 10^{13}$ atoms/cm$^3$.

11. A semiconductor device according to claim 1, wherein the resistivity of each of said first and second resistor layers is lower than 1 K$\Omega$/$\square$, and the resistivity of said intermediate layer is higher than 100 K$\Omega$/$\square$.

12. A semiconductor device according to claim 1, wherein said first and second resistor layers and said intermediate layer comprise polycrystalline silicon.

13. A semiconductor device according to claim 1, wherein said fixed reference potential is one of ground potential and power source potential.

14. A semiconductor device comprising:
a semiconductor substrate having an insulating layer disposed on one surface thereof;
an insulated-gate field effect transistor to be protected provided on said substrate, said insulated-gate field effect transistor being comprised of:
  (i) source and drain regions disposed on a surface region of said substrate,
  (ii) a gate insulating layer disposed between said source and drain regions, and
  (iii) a gate electrode disposed on said gate insulating layer;
a first resistor layer comprised of silicon containing impurities, disposed on a first portion of said insulating layer, connected to the gate electrode of said insulated-gate field effect transistor, and having a terminal which is coupled to a metal pad which is used for one of a signal input bonding pad and a signal output bonding pad for said transistor and is on a second portion of said insulating layer;
a second resistor layer comprised of silicon containing impurities, disposed on a third portion of said insulating layer, spaced apart from said first resistor layer, wherein the second resistor layer is coupled to a source of fixed reference potential and is not coupled to said gate electrode or said metal pad to which said first resistor is coupled; and
an intermediate layer comprised of silicon having conductivity characteristics different than that of said first and second resistor layers, disposed on a fourth portion of said insulating layer between said first and third portions thereof, and being contiguous with each of said first and second resistor layers wherein the conductivity characteristics of the intermediate layer are set so that said intermediate layer is an insulator which electrically insulates said first and second resistors from one another until a predetermined voltage potential between the first and second resistors across said intermediate layer is reached.

15. A semiconductor device according to claim 14, wherein said intermedite layer comprises silicon undoped with impurities.

16. A semiconductor device according to claim 14, wherein said intermediate layer comprises silicon containing impurities less than that of said first and second resistor layers.

17. A semiconductor device according to claim 14, wherein said first resistor layer, said second resistor layer, and said intermediate layer comprises polycrystalline silicon.

18. A semiconductor device according to claim 16, wherein said first resistor layer, said second resistor layer, and said intermediate layer have a same conductivity type.

19. A semiconductor device according to claim 16, wherein one of said first resistor layer, said second resistor layer, and said intermediate layer has a first conductivity type, and the others have a second conductivity type opposite to said first conductivity type.

20. A semiconductor device according to claim 16, wherein the silicon of said first and second resistor layer has an impurity concentration higher than $1 \times 10^{19}$ atoms/cm$^3$, and the silicon of said intermediate layer has an impurity concentration lower than $1 \times 10^{13}$ atoms/cm$^3$.

21. A semiconductor device according to claim 14, wherein the fixed reference potential is one of ground potential and power source potential.

22. A semiconductor device according to claim 14, wherein the gate electrode of said field effect transistor is comprised of silicon containing impurities.

23. A semiconductor device comprising:
a semiconductor substrate having an insulating layer disposed on one surface thereof;
a transistor to be protected provided on said substrate;
a terminal layer which is used for one of signal input and signal output to said transistor and is comprised of metal and disposed on a first portion of said insulating layer, said terminal layer being coupled to a first voltage source; and
means for coupling the terminal layer to the transistor and for clamping the maximum voltage between the terminal layer and the transistor to a predetermined value, comprising:
a first resistor layer comprised of silicon containing impurities, disposed on a second portion of said insulating layer, and having two terminals, the first of which is connected to one terminal of said transistor, and the second of which is connected to said terminal layer;
a second resistor layer comprised of silicon containing impurities, disposed on a third portion of said insulating layer, spaced apart from said first resistor layer, wherein said second resistor layer is coupled to a source of fixed reference potential and is not coupled to said one transistor terminal and said terminal layer to which said first resistor is coupled; and
an intermediate layer comprised of silicon having conductivity characteristics different than that of said first and second resistor layers, disposed on a fourth portion of said insulating layer between said second and third portions thereof, and being contiguous with each of said first and second resistor layers, wherein the width and conductivity characteristics of the intermediate resistor layers are set so that said intermediate layer is in an insulator which electrically insulates said first and second resistors from one another until the occurrence of a punch through effect through said intermediate layer when the potential between the first resistor layer and the second resistor layer across the intermediate layer reaches a predetermined voltage to thereby clamp the voltage between the terminal layer and the transistor to said predetermined voltage.

24. A semiconductor device comprising:
a semiconductor substrate having an insulating layer disposed on one surface thereof;
an insulated-gate field effect transistor to be protected provided on said substrate, said insulated-gate field effect transistor being comprised of:
(i) source and drain regions disposed on a surface region of said substrate,
(ii) a gate insulating layer disposed between said source and drain regions, and
(iii) a gate electrode disposed on said gate insulating layer;
a metal pad which is used for one of a signal input bonding pad and a signal output bonding pad and is disposed on a first portion of said insulating layer, said metal pad being coupled to a first voltage source, and means for coupling the metal pad to the gate electrode and for clamping the maximum voltage between the metal pad and the gate electrode to a predetermined voltage comprising:
a first resistor layer comprised of silicon containing impurities, disposed on a second portion of said insulating layer, connected to the gate electrode of said insulated-gate field effect transistor, and having a terminal which is coupled to the metal pad;
a second resistor layer comprised of silicon containing impurities, disposed on a third portion of said insulating layer, spaced apart from said first resistor layer, wherein said second resistor layer is coupled to a source of fixed reference potential and is not coupled to said gate electrode and said metal pad to which said first resistor is coupled; and
an intermediate layer comprised of silicon having conductivity characteristics different than that of said first and second resistor layers, disposed on a fourth portion of said insulating layer between said second and third portions, thereof, and being contiguous with each of said first and second resistor layers, wherein the width and conductivity characteristics of the intermediate resistor layers are set so that said intermediate layer is an insulator which electrically insulates said first and second resistors from one another until the occurrence of a punch through effect through said intermediate layer when the potential between the first resistor layer and the second resistor layer across the intermediate layer reaches a predetermined voltage to thereby clamp the voltage between the terminal layer and the transistor to said predetermined voltage.

25. A semiconductor device according to claim 1, wherein said terminal layer is a bonding pad comprised of metal and disposed on said first portion of said insulating layer.

26. A semiconductor device according to claim 1, wherein said transistor to be protected is an insulated-gate field effect transistor.

27. A semiconductor device according to claim 26 wherein the first terminal of said first resistor layer is connected to one of a gate, a drain and a source of said transistor.

28. A semiconductor device according to claim 1, wherein said transistor to be protected is a bipolar transistor.

29. A semiconductor device according to claim 1, wherein said intermediate layer comprises silicon undoped with impurities.

* * * * *